United States Patent
Palmteer et al.

(10) Patent No.: US 7,034,382 B2
(45) Date of Patent: Apr. 25, 2006

(54) LEADFRAME-BASED CHIP SCALE PACKAGE

(75) Inventors: William James Palmteer, North Andover, MA (US); Philip Joseph Beucler, Danville, NH (US)

(73) Assignee: M/A-COM, Inc., Lowell, MA (US)

(*) Notice: Subject to any disclaimer, the term of this patent is extended or adjusted under 35 U.S.C. 154(b) by 0 days.

(21) Appl. No.: 09/966,222

(22) Filed: Sep. 28, 2001

(65) Prior Publication Data

US 2002/0149091 A1    Oct. 17, 2002

Related U.S. Application Data

(60) Provisional application No. 60/284,029, filed on Apr. 16, 2001.

(51) Int. Cl.
*H01L 23/495* (2006.01)
(52) U.S. Cl. ............................................. 257/676
(58) Field of Classification Search ............ 257/666, 257/669, 674, 676; 361/813, 767; 264/274
See application file for complete search history.

(56) References Cited

U.S. PATENT DOCUMENTS

| | | | | |
|---|---|---|---|---|
| 4,797,726 A | * | 1/1989 | Manabe | 257/70 |
| 4,862,246 A | | 8/1989 | Masuda et al. | 357/70 |
| 4,884,124 A | * | 11/1989 | Mori et al. | 257/783 |
| 4,918,511 A | * | 4/1990 | Brown | 357/70 |
| 4,942,452 A | * | 7/1990 | Kitano et al. | 257/666 |
| 4,952,999 A | * | 8/1990 | Robinson et al. | 257/669 |
| 5,150,193 A | * | 9/1992 | Yasuhara et al. | 257/669 |

(Continued)

FOREIGN PATENT DOCUMENTS

| | | |
|---|---|---|
| EP | 0 533 137 A2 | 3/1993 |
| EP | 0 655 782 A2 | 5/1995 |

(Continued)

*Primary Examiner*—David A. Zarneke

(57) ABSTRACT

An improved leadframe-based CSP and a method of forming the leadframe-based CSP are provided. The leadframe-based CSP includes a leadframe including a die attach pad and a plurality of wire bonding pads, at least one aperture disposed in the die attach pad, at least one die on the die attach pad, at least one bonding wire for electrically connecting the die and the wire bonding pads, and a mold compound for encapsulating the die and the bonding wire to form a chip package, wherein the mold compound is formed in the aperture.

7 Claims, 3 Drawing Sheets

U.S. PATENT DOCUMENTS

| | | | | |
|---|---|---|---|---|
| 5,233,222 A | * | 8/1993 | Djennas et al. | 257/676 |
| 5,397,915 A | * | 3/1995 | Nose | 257/676 |
| 5,661,338 A | * | 8/1997 | Yoo et al. | 257/676 |
| 5,693,984 A | | 12/1997 | Ootsuki | 257/796 |
| 5,708,294 A | * | 1/1998 | Toriyama | 257/676 |
| 5,712,507 A | * | 1/1998 | Eguchi et al. | 257/666 |
| 5,729,049 A | * | 3/1998 | Corisis et al. | 257/666 |
| 5,834,837 A | * | 11/1998 | Song | 257/692 |
| 5,847,446 A | * | 12/1998 | Park et al. | 257/676 |
| 5,874,773 A | * | 2/1999 | Terada et al. | 257/676 |
| 6,137,160 A | * | 10/2000 | Ishikawa | 257/676 |
| 6,143,981 A | * | 11/2000 | Glenn | 174/52.4 |
| 6,191,490 B1 | * | 2/2001 | Huang | 257/782 |
| 6,258,629 B1 | * | 7/2001 | Niones et al. | 438/111 |
| 6,329,706 B1 | * | 12/2001 | Nam | 257/666 |
| RE37,690 E | * | 5/2002 | Kitano et al. | 257/666 |
| 6,388,311 B1 | * | 5/2002 | Nakashima et al. | 257/676 |
| 6,437,427 B1 | * | 8/2002 | Choi | 257/666 |
| 6,608,375 B1 | * | 8/2003 | Terui et al. | 257/691 |
| 6,639,306 B1 | * | 10/2003 | Huang | 257/667 |
| 6,713,849 B1 | * | 3/2004 | Hasebe et al. | 257/667 |

FOREIGN PATENT DOCUMENTS

| | | |
|---|---|---|
| EP | 0 835 047 A2 | 4/1998 |

* cited by examiner

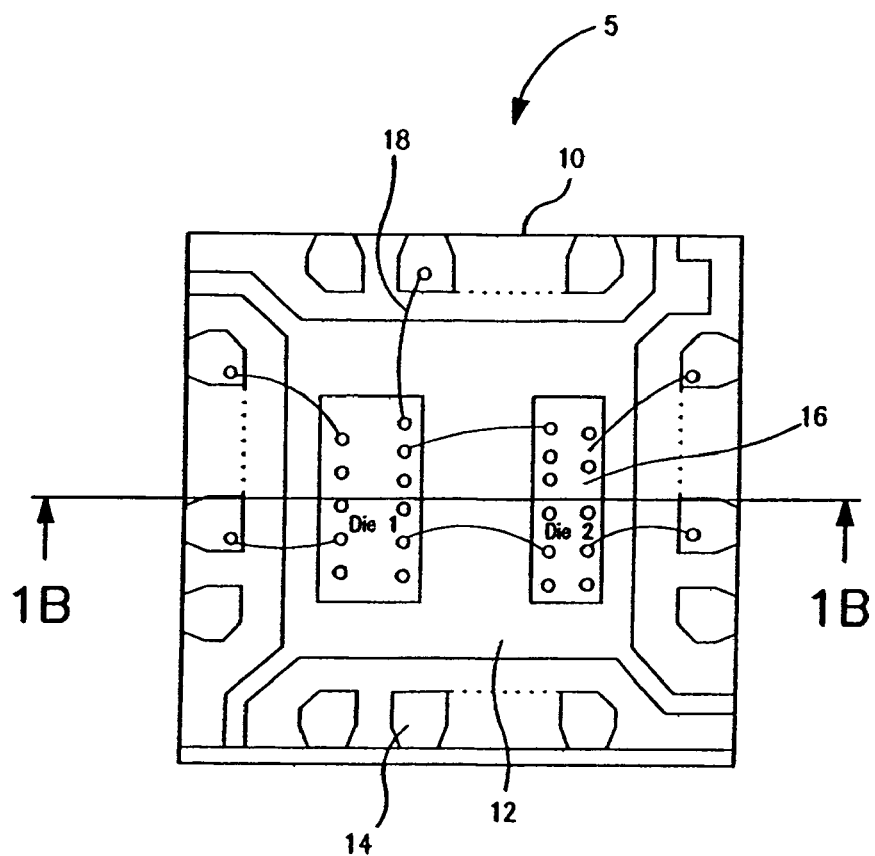
FIG. IA
conventional art
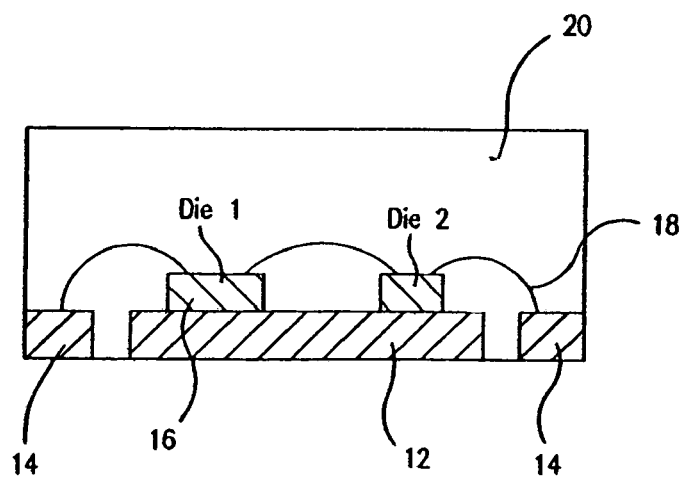
FIG. IB
conventional art

LEADFRAME-BASED CHIP SCALE PACKAGE

RELATED APPLICATION

The present application claims the benefit of priority based on U.S. Provisional Application No. 60/284,029, filed on Apr. 16, 2001, assigned to the same assignee as the present invention, and entitled "Improved Leadframe-Based Chip Scale Package," which is herein fully incorporated by reference.

FIELD OF THE INVENTION

The present invention relates to leadframe-based CSPs (Chip Scale Packages) and, more particularly, to leadframe-based CSPs with an enhanced leadframe that promotes mold compound-leadframe adhesion and improves RF (Radio Frequency) grounding characteristics.

BACKGROUND OF THE INVENTION

Chip Scale Packages (CSPs) are packages that incorporate chip(s) that satisfy certain dimensional requirements in which the package area is slightly larger than the chip(s) area but smaller than conventional chip packages. Leadframe-based CSPs are CSPs that do not have the peripheral leads that typically extend out from conventional chip packages. Due to this structure and design, the leadframe-based CSPs are known for their cost-effectiveness, compactness and improved RF performance. A variety of different types of leadframe-based CSPs are available in the market, such as Micro-Lead Packages (MLPs), Micro-Lead-Frames (MLFs), Leadless Package Chip Carriers (LPCC), etc. The Joint Electron Device Engineering Council (JEDEC), which is a committee that establishes industry standards and packaging outlines, has defined certain package outlines for leadframe-based CSPs. In the package outlines known as "MO-220," the committee has classified the leadframe-based CSPs as HP-VFQFP-Ns or HP-WFQFP-Ns. More information about such packages is available at the website of http:/www.jedec.org/home/about jedec.htm.

FIG. 1A is a plan view of a conventional leadframe-based CSP 5 such as a conventional LPCC, and FIG. 1B is a cross-sectional view of the conventional leadframe-based CSP cut along line 1B—1B of FIG. 1A. As shown in FIGS. 1A and 1B, the conventional leadframe-based CSP 5 includes a leadframe 10 having a center pad or die attach pad 12 centrally located therein and a plurality of wire bonding pads 14 peripherally located therein, at least one chip or die 16 disposed on the die attach pad 12, a plurality of bonding wires 18 for electrically connecting the die 16 to the wire bonding pads 14, and a mold compound 20 (shown in FIG. 1B), such as plastic, for encapsulating these components in a package structure. Typically, the mold compound 20 is molded around the leadframe 10 after the die 16 and the bonding wires 18 have been mounted on the leadframe 10. The mold compound 20 enhances the fixture of these components in the package and prevents electrical short circuits between the bonding wires and the die(s) and the introduction of moisture, dust and other contaminants into the package.

A significant problem arises, however, in such conventional leadframe-based CSPs because the mold compound often does not properly adhere to the surface of the die attach pad. This problem can create certain gaps between the surfaces of the mold compound and the die attach pad (also known as delamination), which increases the likelihood of moisture and other contaminants seeping into the package through such gaps. This degrades the Moisture Sensitivity Level (MSL) of the package which indicates the moisture receptivity of a chip package. The degradation of the MSL and the inadequate bonding of the mold compound to the die attach pad degrades the electrical performance of the conventional leadframe-based CSPs.

Accordingly, there is a need for an improved leadframe-based CSPs that overcomes the adhesion and moisture sensitivity problems of conventional leadframe-based CSPs.

SUMMARY OF THE INVENTION

The present invention provides an improved leadframe-based CSP capable of improving the adhesion of a mold compound to a die attach pad. Particularly, the leadframe-based CSP of the present invention provides an aperture in the die attach pad which increases the adhesion surface area of the die attach pad for the mold compound. This improves the performance characteristics and reliability of the leadframe-based CSP.

Accordingly, the present invention is directed to a chip package comprising a leadframe including a die attach pad centrally located therein and a plurality of wire bonding pads peripherally located therein; at least one aperture placed in the die attach pad; at least one die positioned on the die attach pad; at least one bonding wire for electrically connecting the die and the wire bonding pads; and a mold compound for encapsulating the die and the bonding wire to form a chip package, wherein the mold compound is formed in the aperture and the aperture increases an adhesion surface area for the mold compound.

The present invention is further directed to a method of providing a chip package, including the steps of providing a leadframe including a die attach pad centrally located therein and a plurality of wire bonding pads peripherally located therein; providing at least one aperture in the die attach pad; providing at least one die on the die attach pad; providing at least one bonding wire for electrically connecting the die and the wire bonding pads; and providing a mold compound for encapsulating the die and the bonding wire to form a chip package, wherein the mold compound is formed in the aperture and the aperture increases an adhesion surface area for the mold compound.

BRIEF DESCRIPTION OF THE DRAWINGS

FIG. 1A is a plan view of a conventional leadframe-based CSP.

FIG. 1B is a cross sectional view of the conventional leadframe-based CSP cut along line 1B—1B of FIG. 1A.

DETAILED DESCRIPTION OF THE PREFERRED EMBODIMENTS

Figure 2A:
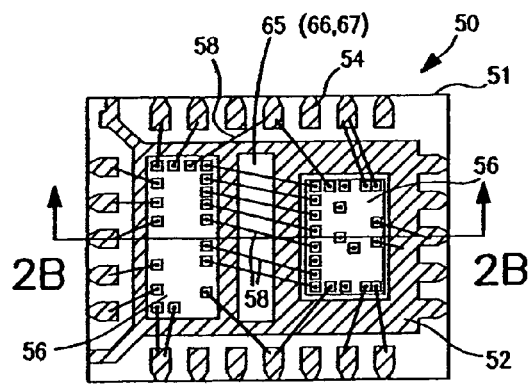
FIG. 2A is a plan view of a leadframe-based CSP according to a first embodiment of the present invention.

In the drawings, the same reference numerals are used to indicate the same elements.

Figure 2B:
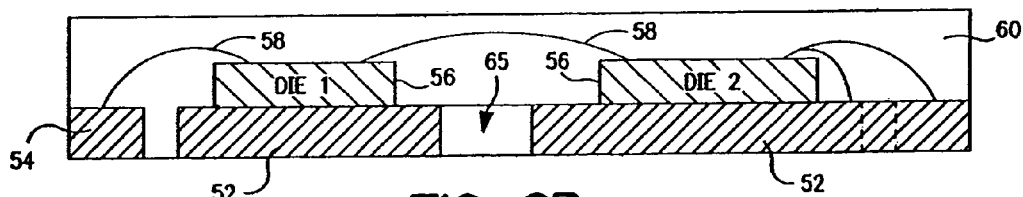
FIG. 2B is a cross-sectional view of the leadframe-based CSP cut along line 2B—2B of FIG. 2A.

FIG. 2A is a plan view of a leadframe-based CSP 50 according to a first embodiment of the present invention, and FIG. 2B is a cross-sectional view of the leadframe-based CSP 50 cut along line 2B—2B of FIG. 2A. As shown in FIGS. 2A and 2B, the lead-frame-based CSP 50 includes a leadframe 51 including a die attach pad 52 centrally located therein and a plurality of wire bonding pads 54 peripherally located therein, one or more dies 56 mounted on the die attach pad 52, a plurality of bonding wires 58 for electrically connecting the dies 56 and the wire bonding pads 54, at least one aperture 65 disposed in the die attach pad 52 between the dies 56, and a mold compound 60 (shown in FIG. 2B) for encapsulating these components in a package structure. The leadframe 51 is made with a conductive material such as metal.

The aperture 65 is formed completely through the die attach pad 52 using known etching techniques such as full etch process, half etch process, a combination of full and half etch processes, any other suitable etch process, stamping, coining, or any other suitable lead-frame manufacturing process. This aperture 65 provides a greater surface area to which the mold compound 60 could adhere, thereby enhancing the adhesion of the mold compound to the die attach pad 52. That is, the aperture 65 increases the adhesion surface area for the mold compound 60 without affecting the overall dimensions of the CSP 50. The increased adhesion surface area prevents the degradation of the Moisture Sensitivity Level (MSL) of the CSP 50, the introduction of contaminants such as dusts into the CSP 50, and the occurrence of electrical short circuits in the CSP 50.

Furthermore, in some applications such as high dynamic range devices (e.g., operating at $\geq 30$ dB), the aperture 65 improves the RF grounding characteristics of such electronic devices. Excessively long ground paths can have the effect of raising the noise level for the high dynamic range devices. By separating the die attach pad 52 into sections by forming the aperture 65 in the die attach pad of the high dynamic range devices, the present invention provides means for reducing the length of the ground paths and confining the RF ground return currents to specific parts of the circuit board. This improves the RF grounding characteristics of the high dynamic range devices.

Figure 2C:
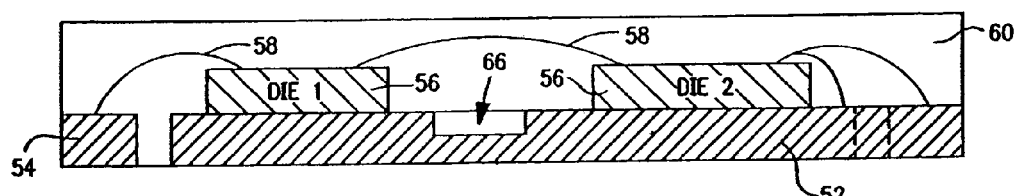
FIG. 2C is a cross-sectional view of the leadframe-based CSP according to a second embodiment of the present invention.

FIG. 2C is a cross-sectional view of the leadframe-based CSP according to a second embodiment of the present invention. The leadframe-based CSP shown in FIG. 2C is identical to the leadframe-based CSP in FIG. 2B, except for an aperture 66. As shown in FIG. 2C, in this embodiment, the aperture 66 is formed partially through the die attach pad 52 using known etching processes such as half etch processes. Because the aperture 66 increases the adhesion surface area for the mold compound by providing a greater surface area to which the mold compound can adhere, the aperture 66 improves the performance characteristics and reliability of the leadframe-based CSP similarly to the features of the first embodiment.

Figure 2D:
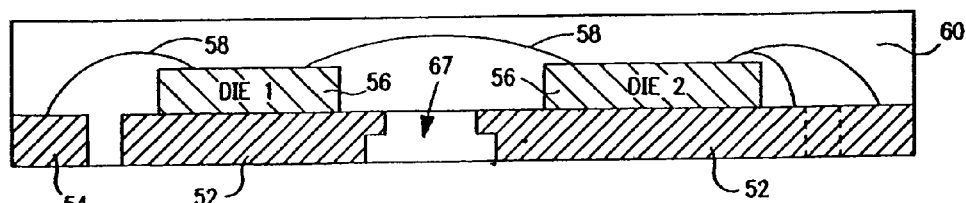
FIG. 2D is a cross-sectional view of the leadframe-based CSP according to a third embodiment of the present invention.

FIG. 2D is a cross-sectional view of the leadframe-based CSP according to a third embodiment of the present invention. The leadframe-based CSP shown in FIG. 2D is identical to the leadframe-based CSP in FIG. 2B, except for an aperture 67. As shown in FIG. 2D, in this embodiment, the aperture 67 is formed using a combination of a full etch process and a half etch process and increases the adhesion surface area for the mold compound, thereby improving the leadframe-based CSP.

Figure 3:
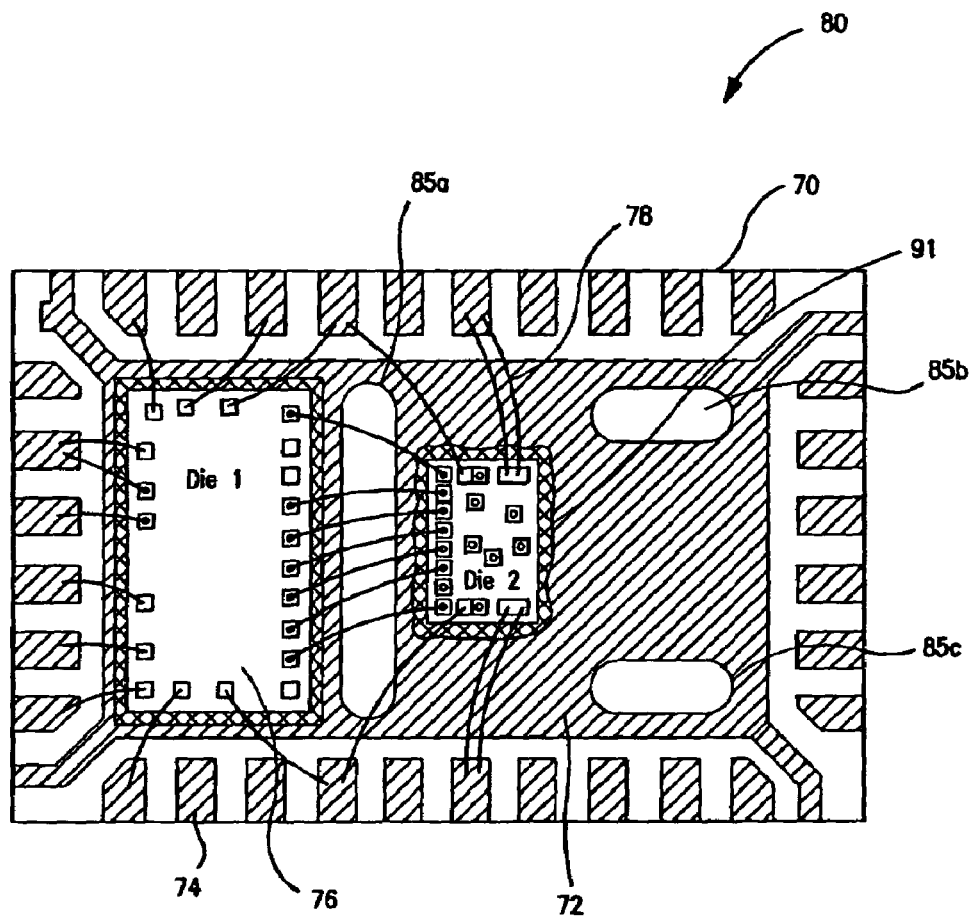
FIG. 3 is a plan view of a leadframe-based CSP according to a fourth embodiment of the present invention.

FIG. 3 is a plan view of a leadframe-based CSP 80 according to a fourth embodiment of the present invention. As shown in FIG. 3, the leadframe-based CSP 80 includes a leadframe 70 including a die attach pad 72 centrally located therein and a plurality of wire bonding pads 74 peripherally located therein, one or more dies 76 mounted on the die attach pad 72 using bonding materials 71, a plurality of bonding wires 78 for electrically connecting the dies 76 and the wire bonding pads 74, and a mold compound (not shown) for encapsulating these components in a package structure.

In this embodiment, there are a plurality of apertures 85a, 85b, 85c located in the die attach pad 72. These apertures 85a, 85b, 85c (collectively 85) have an oval shape and extend vertically or horizontally, but can extend in any direction, e.g., diagonally. The apertures 85 can be formed partially or fully through the die attach pad 72 as discussed above using a full etch process, half etch process, a combination of full and half etch processes, any other suitable etch process, stamping, coining, or any other suitable lead-frame manufacturing process. The apertures 85 provide a greater surface area to which the mold compound can adhere. This prevents introduction of contaminants and moisture into the package and improves the electrical characteristics of the package.

According to the present invention, the aperture (e.g., aperture(s) 65, 66, 67, 85) formed in the die attach pad of the leadframe-based CSP can be formed in any shape, configuration, or size using conventional etching processes, as long as the aperture increases the adhesion surface area in the die pad area for the mold compound. For example, the aperture can be a rectangle, an oval, a circle, a square, a triangle, or any combination therefore. Further, the aperture can be located at any location in the die attach pad regardless of a die location, e.g., between the dies or adjacent to die(s). Moreover, a plurality of such apertures may be formed in the die attach pad (e.g., as shown in FIG. 3). All these variations are contemplated as part of the present invention.

Accordingly, the present invention provides at least one aperture in the die attach pad of a chip package for increasing the adhesion surface area for the mold compound in the die attach pad area, whereby it prevents the degradation of the MSL of the leadframe-based CSP, the introduction of contaminants such as dusts into the leadframe-based CSP, and the occurrence of electrical short circuits in the leadframe-based CSP. The present invention further improves the RF grounding characteristics of the chip package.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A chip scale package comprising:
   a lead frame including at least a die attach pad for connection directly to a circuit board, a plurality of wire bonding pads peripherally located thereon, and at least one aperture formed fully through said die attach pad to separate said the die attach pad into different sections;
   at least one die having a first surface and an opposing second surface and being mounted on a section of said die attach pad such that substantially the entire opposing second surface contacts said die attach pad, thereby forming a grounding path which is confined to said section and leads from said at least one die, through said section, and to said circuit board;

at least one bonding wire for electrically connecting said at least one die and at least one of said plurality of wire bonding pads; and a mold compound, wherein said mold compound encapsulates said at least one die and said at least one bonding wise to form a chip scale package, and wherein the mold compound resides in said the at least one aperture.

2. The chip package of claim 1, wherein said aperture is formed using a full etch process.

3. The chip package of claim 1, wherein the shape of said aperture is one of the following a rectangle, a square, an oval, a triangle, a circle, or a combination thereof.

4. The chip package of claim 1, wherein the chip package is a leadframe-based Chip Scale Package.

5. The chip package of claim 1, wherein said the aperture includes a plurality of apertures formed around said the at least one die.

6. The chip package of claim 5, wherein said the at least one die comprises at least a first and a second die, and at least one of said the plurality of apertures is disposed between said first die and said the second die.

7. A method for improving radio frequency grounding in a high dynamic range device comprising operating a chip scale package at radio frequency (RF), said chip scale package comprising:

a leadframe including at least a die attach pad for connection directly to a circuit board, and a plurality or wire bonding pads peripherally located thereon, and at least one aperture formed fully through said die attach and to separate said die attach pad into different sections;

at least one die having a first surface and an opposing second surface and being mounted on a section of said die attach pad such that substantially the entire opposing second surface contacts said die attach pad, thereby forming an RF grounding path which is confined to said section and leads from said at least one die, through said section, and to said circuit board;

at least one bonding wire for electrically connecting said at least one die and at least one of said plurality of wire bounding pads; and a mold compound, wherein said mold compound encapsulates said at least one die and said at least one bonding wire to form a chip scale package, and wherein the mold compound resides in said least one aperture.

* * * * *